United States Patent [19]

Kachlic et al.

[11] Patent Number: 5,178,564
[45] Date of Patent: Jan. 12, 1993

[54] ELECTRICAL CONNECTOR WITH SOLDER MASK

[75] Inventors: Jerry D. Kachlic, Singapore, Singapore; B. Alan Berg, Mount Prospect, Ill.

[73] Assignee: Molex Incorporated, Lisle, Ill.

[21] Appl. No.: 793,975

[22] Filed: Nov. 18, 1991

Related U.S. Application Data

[63] Continuation-in-part of Ser. No. 615,511, Nov. 19, 1990, abandoned.

[51] Int. Cl.⁵ .................................................. H01R 4/02
[52] U.S. Cl. ........................................ 439/876; 439/78
[58] Field of Search ................................. 439/874–876, 439/80–83, 78; 228/180.1; 29/837

[56] References Cited

U.S. PATENT DOCUMENTS

| | | | |
|---|---|---|---|
| 3,525,143 | 8/1970 | De Vito | 228/180.1 |
| 3,966,110 | 6/1976 | Boynton | 228/180.1 |
| 4,342,415 | 8/1982 | Wachs | 439/876 |
| 4,425,015 | 1/1984 | Rizzo | 439/83 |
| 4,750,889 | 6/1988 | Ignasiak | 439/83 |
| 4,916,806 | 4/1990 | Lounzen | 29/837 |

Primary Examiner—David L. Pirlot
Attorney, Agent, or Firm—Charles S. Cohen

[57] ABSTRACT

An electrical connector is provided for mounting to a printed circuit board. The connector includes an insulating housing having a body with a through cavity for receiving an electrical terminal to be soldered to a circuit trace on a printed circuit board. A solder masking hollow peg projects from one side of the body for insertion in a hole in the printed circuit board for preventing solder from entering the hole during soldering of the electrical terminal to the circuit trace on the printed circuit board. The interior of the hollow peg communicates with the through cavity in the body to allow a mating terminal to be inserted through the hollow peg into contact with the terminal inside the body.

9 Claims, 3 Drawing Sheets

ELECTRICAL CONNECTOR WITH SOLDER MASK

RELATED APPLICATION

This is a continuation-in-part of co-pending application Ser. No. 07/615,511, filed Nov. 19, 1990, entitled "Electrical Contact Pin Receiving Terminal", now abandoned assigned to the assignee of this application.

FIELD OF THE INVENTION

This invention generally relates to the art of electrical connectors and particularly to a connector for mounting to a printed circuit board and including solder mask means to prevent solder from entering holes in the printed circuit board during soldering of terminals to circuit traces on the board.

BACKGROUND OF THE INVENTION

Many electrical connectors conventionally are fabricated with a dielectric housing, such as molded of plastic material, for mounting a plurality of electrical terminals, such as stamped and formed metal contacts. One such connector may comprise a receptacle for mating with a plug connector, sometimes called female and male connector components. The terminals, likewise, may be formed as receptacle terminals for receiving pin terminals from the mating connector.

Electrical connectors of the character described above desirably have various characteristics such as reliable contact forces between the terminals in a transverse direction and, in some instances, anti-overstress protection for flexible portions of the stamped and formed terminals. It may be desirable for the receptacle connector and receptacle terminal to be capable of accepting a mating plug connector and pin terminal to be capable of accepting a mating plug connector and pin terminal from either direction, sometimes called "top and bottom" mating. When such connectors are used as headers, such as for surface mounting on a printed circuit board, it often is desirable that the connectors have a low profile in a direction transverse to the board.

One of the problems with electrical connectors or headers of the character described above involves solder contamination of the terminals during manufacture or processing of the connectors. In particular, when the terminals are female or receptacle terminals, solder tails are provided for insertion into holes in the printed circuit board. When the terminals are soldered to circuit traces or plated-through holes in the board, there is a tendency for some of the solder to flow into the housing which would contaminate or render inoperable the receptacle portion of the terminal. This is particular true of housings in which a complementary pin terminal is inserted into the receptacle terminal from below the printed circuit board.

For instance, a typical soldering method is called wave soldering, wherein the printed circuit board is passed through a molten solder wave that contacts the surface of the printed circuit board to establish solder connections between the solder tails of the receptacle terminal and the plated-through holes or the circuit traces on the printed circuit board surface. Normally, due to capilary action solder flows into the holes or any space left between the solder tails and the holes, with a possibility that the solder could enter the housing or build up on the solder tail and thus contaminate the receptacle portions of the terminals which would prevent a good electrical connection with a complementary pin terminals.

An example of an approach to prevent solder contamination as described above, is to provide a solder mask as shown in U.S. Pat. No. 4,750,889 to Ignasiak et al, dated June 14, 1988. This patent shows a through-board electrical component header having an integral solder mask means in the form of masking pins integrally attached to a body of the connector for insertion into the holes in the printed circuit board to completely block the openings and prevent solder from entering the holes. However, the solder masking pins, after the soldering process has been completed, must be removed in order to gain access to the receptacle portions of the terminals within the header body. In essence, the solder masking pins must be provided with some form of frangible means or portions to facilitate their removal. Such a system thus requires an additional step in the processing and mounting of the header to the printed circuit board before the assembly is ready for use. Such additional processing step adds to the expense and complexity of the assembly.

This invention is directed to solving the above problems by an improved solder masking technique which is processed using the same manufacturing procedures of non-solder masked connectors mounted to a printed circuit board.

SUMMARY OF THE INVENTION

An object, therefore, of the invention is to provide an electrical connector for mounting to a printed circuit board with a new and improved solder masking means for preventing solder from blocking entry to the holes in the printed circuit board and protecting the contact from solder.

In the exemplary embodiment of the invention, the electrical connector, or header, includes an insulating housing having a body with a through cavity for receiving an electrical terminal to be soldered to a circuit trace on the printed circuit board. A solder masking hollow peg projects from one side of the body for insertion in a hole in the printed circuit board for preventing solder from entering the hole during soldering of the electrical terminal to the circuit trace on the printed circuit board. The interior of the hollow peg communicates with the through cavity in the body to allow a mating terminal to be inserted through the hollow peg into contact with the terminal inside the body.

As disclosed herein, the hollow peg projects slightly beyond the printed circuit board on a side thereof opposite the side of the board to which the housing is mounted. The body includes an opening outside the peg through which a solder tail of the electrical terminal projects. The terminal includes a receptacle portion in the through cavity of the body for receiving a mating terminal inserted through the hollow peg.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
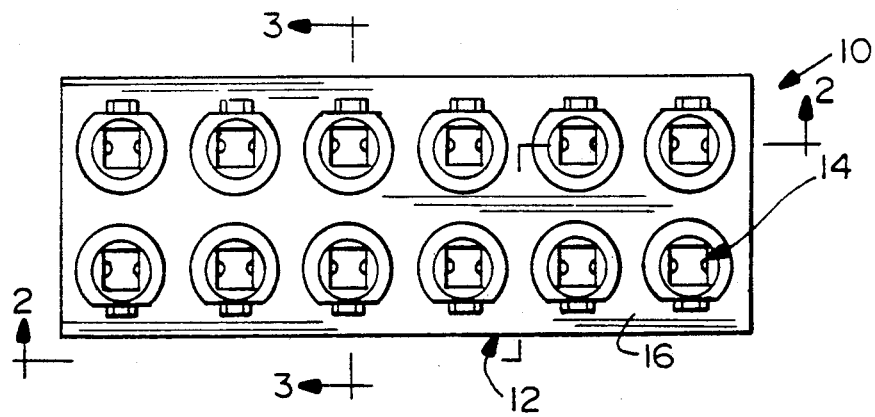
FIG. 1 is a plan view of an electrical connector incorporating the features of the present invention.
Figure 2:
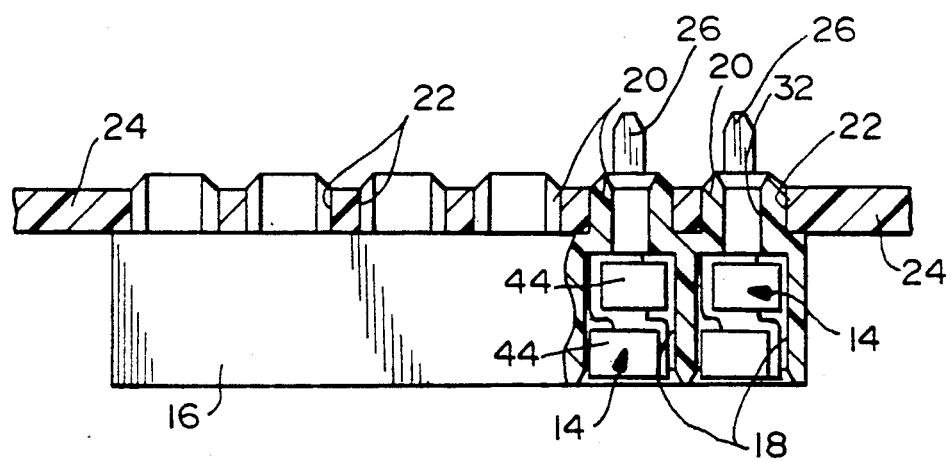
FIG. 2 is an elevational view of the connector housing, partially in section as along line 2—2 of FIG. 1, with the terminals shown in elevation.
Figure 3:
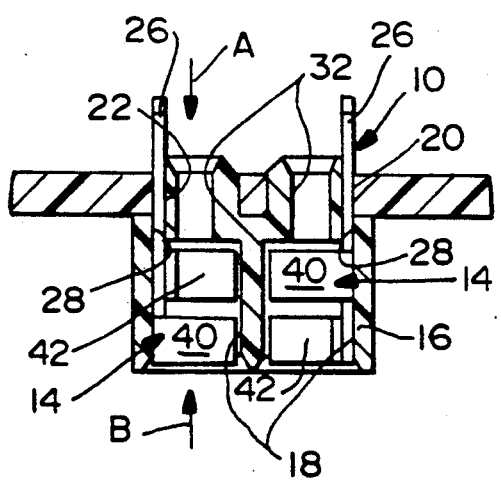
FIG. 3 is a vertical section taken generally along line 3—3 of FIG. 1, with the terminals shown in elevation.

Referring to the drawings in greater detail, and first to FIGS. 1-3, the invention is illustrated as embodied in an electrical connector, generally designated 10, which includes a dielectric housing, generally designated 12, for receiving a plurality of receptacle contacts or terminals, generally designated 14, which embody the concepts of the invention.

Housing 12 includes a body 16 having a plurality of cavities 18 which receive terminals 14. A plurality of hollow pegs 20 project upwardly from body 16 for insertion through appropriate holes 22 in a printed circuit board 24 to which the connector is mounted.

As seen in FIG. 3, an opening 28 in body 16, outside of each peg 20, is provided and through which a solder tail 26 (described hereinafter) of a respective terminal 14 extends through the respective hole 22 in circuit board 24. The solder tail is appropriately connected by soldering to circuit traces on side 30 of the circuit board or to through plating in the holes in the board.

As seen in FIGS. 2 and 3, hollow pegs 20 project slightly beyond the side 30 of printed circuit board 24 opposite the side of the board to which body 16 is mounted. With solder tails 26 projecting through the printed circuit board on the outside of hollow pegs 20, the solder tails are exposed exteriorly of the hollow pegs for soldering to circuit traces on the opposite side of the printed circuit board or to through plating in the holes in the board. The soldering may be carried out by conventional wave soldering techniques wherein a molten solder wave contacts the opposite side 30 of the printed circuit board to solder the solder tails to the circuit traces or hole plating. With the hollow pegs projecting beyond the opposite side 30 or surface of the printed circuit board and solder tail 26 being positioned outside of bore 32, as shown in FIGS. 2 and 3, the solder wave is sufficiently blocked from entering the distal ends of the pegs and into the cavities 18 in body 16 where the solder would, otherwise, contaminate the terminals within the cavities.

Terminals 14 will be described in greater detail, but in the context of connector 10 in FIGS. 1-3, the terminals are designed for receiving contact pins (not shown) insertable into housing 12 from a mating or complementary connector either from the top of the connector 10, as shown by arrow "A" (FIG. 3) through a bore 32 in each peg 20, or from the bottom of the connector, in the direction of arrow "B", into contact with a terminal disposed within the respective cavity in the housing. It should be understood that the above description of surface mounted connector 10 on a printed circuit board 24 is but one example of using the novel terminal 14 of the invention. The terminal is equally applicable for use in other types of connectors.

Figure 4:
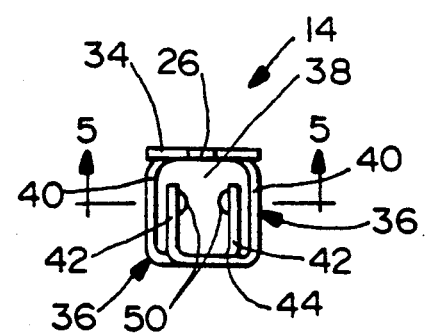
FIG. 4 is an end view looking in a direction through the pin receiving opening of one of the terminals of the invention.
Figure 5:
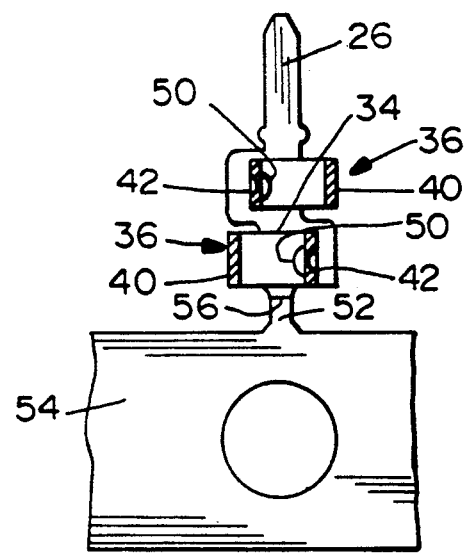
FIG. 5 is a vertical section taken generally along line 5—5 of FIG. 4, with the terminal shown still attached to a web of a blank from which the terminal is stamped and formed.

More particularly, referring to FIGS. 4 and 5, each terminal 14 includes a generally flat base 34 from which solder tail 26 extends in a coplanar manner. The terminal includes a pair of generally U-shaped members, generally designated 36, which combine to define a contact pin receiving opening 38 (FIG. 4).

Each U-shaped member 36 includes a first leg 40 fixed to and projecting generally perpendicularly from base 34, a second or free leg 42 projecting back toward base 34, and a bight portion 44 joining legs 40,42. It can be seen in FIG. 5 that U-shaped members 36 are spaced longitudinally of the terminal (i.e., longitudinally of opening 38 and solder tail portion 26) and are reversed in orientation. To this end, it can be seen that the first legs 40 are disposed laterally outwardly of the second legs 42 of the other U-shaped members. This lateral spacing or disposition allows for flexing of free legs 42 when a contact pin is inserted into opening 38.

Figure 6:
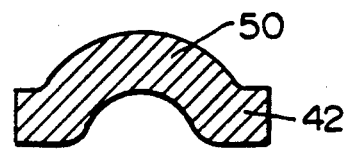
FIG. 6 is a section, on an enlarged scale, through one of the contact detents of the terminal.
Figure 8:
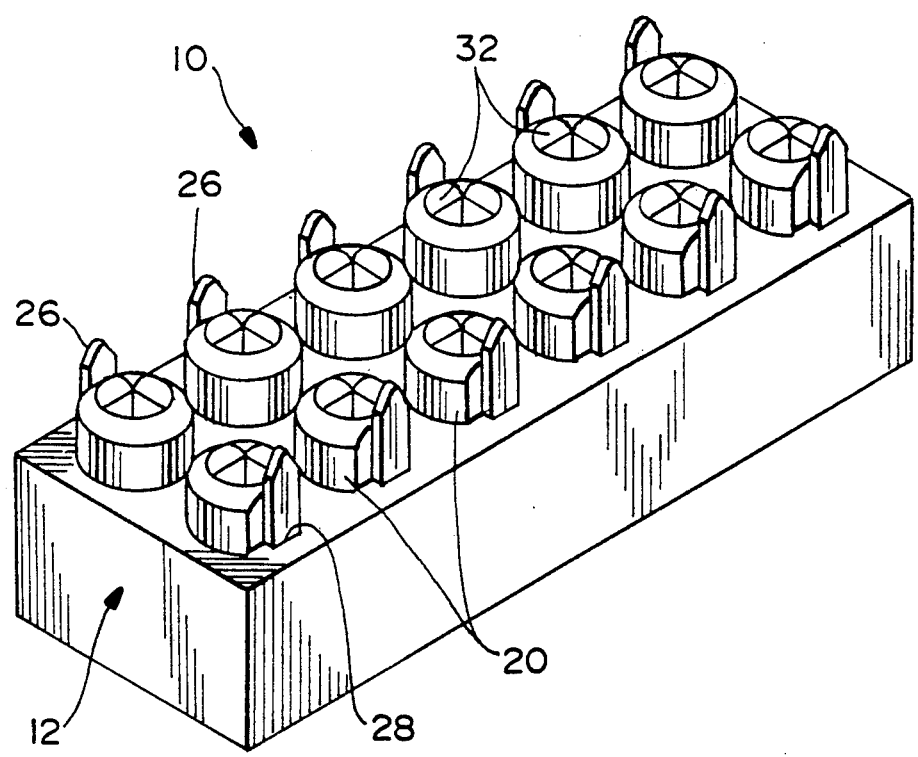
FIG. 8 is a perspective view of the electrical connector of the present invention.

Referring to FIG. 6, in conjunction with FIGS. 4 and 5, leg 42 of each U-shaped member 36 is provided with an inwardly projecting contact detent or dimple 50 which establishes engagement and electrical contact with a mating terminal pin inserted into opening 38.

FIG. 5 shows base 34 of terminal 14 connected by a web 52 to a strip 54 of a metal blank from which the terminal is stamped and formed. This is shown in FIG. 5 simply for illustration purposes. Line 56 represents a score line at which the terminal is severed for insertion into a respective cavity 18 of housing 12.

Figure 7:
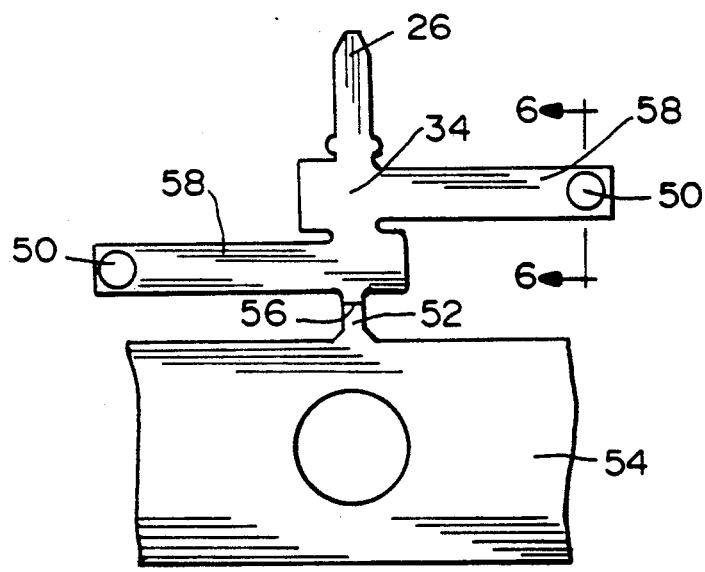
FIG. 7 is an illustration of one of the terminals as being stamped from a metal blank, prior to forming.

More particularly, FIG. 7 shows the components of terminal 14 after having been stamped from a continuous metal blank and with contact detents 50 stamped into distal ends of longitudinally running strips 58 of the blank. Each strip 58 subsequently is formed into the U-shaped members 36 described above. Base 34 and coplanar solder tail 26 are shown in FIG. 7 as having been stamped from the metal blank into the ultimate shapes thereof in the stamped and formed terminal described above in relation to FIGS. 4 and 5.

From the foregoing, it can be seen that an electrical terminal 14 has been provided to define a contact pin-receiving receptacle. The terminal, with U-shaped members 36, provides a very low profile (i.e., longitudinally of the terminal) to facilitate the provision of a very low profile connector 10. The terminal and the connector can be mated with a complementary connector or header from either the top or bottom thereof. Free legs 42 of the U-shaped members provide for high pressure contact reliability, and formed portion 43 of the U-shaped members provide anti-overstress protection for the terminal when a pin is inserted thereinto through opening 38.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An electrical connector for mounting to a first face of a printed circuit board having first and second generally parallel faces and a plurality of holes extending between said surfaces, said connector comprising an insulating housing including a body having a first surface and a plurality of cavities for receiving an electrical terminal therein, a first electrical terminal located within each cavity with a portion of each terminal soldered to a circuit trace on the printed circuit board, each cavity being aligned and in communication with one of said holes to permit a second, mating terminal to be inserted through said hole in said printed circuit board and into said cavity to mate with said first terminal, said housing being positionable so that said first face of said printed circuit board and said first surface of said housing are generally adjacent, wherein the improvement comprises:

a plurality of solder masking hollow pegs projecting from said first surface, each for insertion into one of said plurality of holes in the printed circuit board for preventing solder from entering the hole during soldering of said first electrical terminals to the circuit traces on the printed circuit board, the interior of each hollow peg being aligned and communicating with one of said cavities in the housing to allow said second, mating terminals to be inserted through said hollow pegs and into contact with the first terminal inside the housing.

2. The electrical connector of claim 1 wherein said housing includes an opening outside the peg through which a solder tail of the first electrical terminal projects.

3. The electrical connector of claim 1 wherein said hollow peg projects beyond the second face of the printed circuit board.

4. The electrical connector of claim 3 wherein said housing includes an opening outside the peg through which a solder tail of the first electrical terminal projects.

5. The electrical connector of claim 4 wherein said housing is configured so that said second, mating terminals can enter said housing through either said first surface or a surface opposite said first surface in order to mate with said first terminals.

6. The electrical connector of claim 4 wherein said receptacle portion includes a base, and a pair of U-shaped members which define a contact pin receiving opening, one leg of each U-shaped member being fixed to and projecting from the base and the other leg being free and projecting back toward the base, the U-shaped members being spaced longitudinally of the opening and reverse in orientation.

7. An electrical connector for mounting to a printed circuit board, comprising:

an insulating housing including a body having a through cavity for receiving an electrical terminal to be soldered to a circuit trace on a printed circuit board, and a solder masking hollow peg projecting from one side of the body for insertion in a hole in the printed circuit board, the hollow peg being of a length to project beyond the printed circuit board on a side thereof opposite the side of the board to which the housing is mounted for blocking solder from entering the hole during soldering of the terminal to the circuit trace on the printed circuit board, the interior of the hollow peg communicating with the through cavity in the body to allow a mating terminal to be inserted through the hollow peg into contact with the terminal inside the body, and an opening in the body outside the hollow peg; and an electrical terminal including a receptacle portion in the through cavity in the housing for receiving the mating terminal inserted through the hollow peg, and a solder tail portion projecting through the opening in the housing outside the hollow peg.

8. The electrical connector of claim 7 wherein each said hollow peg is dimensioned so as to be approximately the same size as its mating hole in the printed circuit board.

9. The electrical connector of claim 7 wherein said housing, including said body and hollow peg, are fabricated of unitarily molded dielectric material.

* * * * *